US008351614B2

(12) United States Patent
Wu et al.

(10) Patent No.: US 8,351,614 B2
(45) Date of Patent: Jan. 8, 2013

(54) DIGITAL REVERBERATIONS FOR AUDIO SIGNALS

(75) Inventors: Yuan Wu, Singapore (SG); Sapna George, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 1245 days.

(21) Appl. No.: 11/701,971

(22) Filed: Feb. 2, 2007

(65) Prior Publication Data

US 2007/0195967 A1 Aug. 23, 2007

(30) Foreign Application Priority Data

Feb. 14, 2006 (SG) ................................ 200600974-0

(51) Int. Cl.
*H03G 3/00* (2006.01)

(52) U.S. Cl. ............................................ 381/63; 381/61

(58) Field of Classification Search .............. 381/61-64; 84/630, 707; 700/94
See application file for complete search history.

(56) References Cited

U.S. PATENT DOCUMENTS

| | | | | |
|---|---|---|---|---|
| 4,181,820 | A | 1/1980 | Blesser et al. | |
| 4,955,057 | A | 9/1990 | Tominari | |
| 5,040,219 | A | 8/1991 | Ando et al. | |
| 5,131,051 | A * | 7/1992 | Kishinaga et al. | 381/82 |
| 5,146,507 | A | 9/1992 | Satoh et al. | |
| 5,317,104 | A | 5/1994 | Frost | |
| 5,555,306 | A | 9/1996 | Gerzon | |
| 5,621,801 | A | 4/1997 | Kunimoto et al. | |
| 5,740,716 | A | 4/1998 | Stilson | |
| 6,978,027 | B1 * | 12/2005 | Dahl et al. | 381/63 |
| 7,062,337 | B1 * | 6/2006 | Blesser | 700/94 |
| 7,149,314 | B2 * | 12/2006 | Dahl et al. | 381/63 |
| 2006/0086237 | A1 * | 4/2006 | Burwen | 84/630 |

OTHER PUBLICATIONS

Author: M.R. Schroeder Title: Natural Sounding Artificial Reverberation Date: Oct. 9, 1961 Thirteenth Annual Fall Convnetion of the Audio Engineering Society.*

* cited by examiner

*Primary Examiner* — Vivian Chin
*Assistant Examiner* — Fatimat O Olaniran
(74) *Attorney, Agent, or Firm* — Munck Wilson Mandala, LLP

(57) ABSTRACT

The present disclosure provides a digital audio signal processing system that comprises a set of delay lines, allpass and lowpass filters to achieve the reverberation effect. The present disclosure further provides a method for generating and controlling digital reverberations for audio signals. The reverberation generated will have an increasing echo density in the time domain and a faster decay of high frequency signals than low frequency signals. The controlling mechanism of reverberation generation is realized through the extraction of the real environment characteristics.

25 Claims, 7 Drawing Sheets

DIGITAL REVERBERATIONS FOR AUDIO SIGNALS

CROSS-REFERENCE TO RELATED APPLICATIONS

The present application is related to Singapore Patent Application No. 200600974-0, filed Feb. 14, 2006, entitled "DIGITAL AUDIO SIGNAL PROCESSING METHOD AND SYSTEM FOR GENERATING AND CONTROLLING DIGITAL REVERBERATIONS FOR AUDIO SIGNALS". Singapore Patent Application No. 200600974-0 is assigned to the assignee of the present application and is hereby incorporated by reference into the present disclosure as if fully set forth herein. The present application hereby claims priority under 35 U.S.C. §119(a) to Singapore Patent Application No. 200600974-0.

TECHNICAL FIELD

The present disclosure generally relates to digital audio signal processing technologies, and more particularly to devices for generating and controlling artificial reverberations for audio signals.

BACKGROUND

Artificial reverberations are often used for dry audio contents to simulate effects of real environments. In many applications such as headphone and speaker playbacks, artificial reverberations are added to give the listeners a sense of being in the real environments.

In nature, reverberations are echoes from various reflections in real environments, such as a room. The ideal way of generating reverberations will be convolving the audio signal with the impulse response of the desired environment. Such a method in practice is computationally costly. In a digital signal processing application, it takes huge computational and storage resources to implement this method. To reduce the cost, for example, conventional methods provide an electronic sound processor for creating reverberation effect by convolving random white noise with dry audio signals to simulate the late part of the reverberation.

A number of conventional methods approximate the exact reverberation or to create only the salient signals. Most of the algorithms use feedback loops with delay lines, sometimes combined with allpass filters. For example, in one conventional system, an electric reverberation apparatus includes a plurality of loops having different delay times and adapted to form sound repetitions of diminishing intensity. The loops are typically provided with tappings, each of which has a particular delay time associated with it.

A conventional reverberation effect imparting system includes a number of comb filters, each of which has a signal delay line and a feedback loop for filtering a delayed output signal from the delay line and feeding the filtered signal back to the input side with a variable loop gain. The drawback of such feedback systems is that they will create resonates thus colorizes the sound. These problems may be overcome by phase-shifting or time-variant delay lines in some algorithms, which introduce certain undesired pitch shifting effects.

Other conventional systems use only delay lines and feed forward loops, tapping at different locations of the delay lines. Still other conventional systems use algorithms that separate the reverberations to early and later parts and generate them separately. This typically leads to a sudden increase of echo density at the boundary, which is not true in a natural environment.

There is therefore a need for improved reverberation devices.

SUMMARY

In one embodiment, the present disclosure provides a reverberation device with a uniformed structure for use in digital audio signal processing. The generated artificial reverberations preferably have the characteristics extracted from real environments.

In one embodiment, the present disclosure provides a reverberation generator for use in a digital audio signal processor. The reverberation generator includes an input to receive a digital audio signal input and a summing circuit to generate a digital audio signal output containing the digital audio signal input and reverberations. The reverberation generator also includes a digital audio signal direct path connected to the input and the summing circuit. The reverberation generator further includes feed forward loops configured in a cascade manner, wherein the outputs of the feed forward loops are connected to the summing circuit, a first one of the feed forward loops is connected to the input, and an output of the first feed forward loops is fed to the summing circuit and an input of a second one of the feed forward loops.

In another embodiment, the present disclosure provides a digital audio signal processing system. The digital audio signal processing system includes a digital I/O interface to input and output digital audio signals. The digital audio signal processing system also includes a controlling unit connected to the digital I/O interface to receive the input, wherein the controlling unit extracts reverberation characteristics of the input. The system further includes a reverberation generator connected to the controlling unit, wherein the extracted reverberation characteristics control the configuration of the reverberation generator to generate the reverberations for the input to simulate a real environment.

In still another embodiment, the present disclosure provides a method of generating reverberations for a digital audio signal to simulate real environments. The method includes extracting the reverberation characteristics of the digital audio signal for a real environment. The method also includes translating the extracted reverberation characteristics into controlling parameters for a reverberation generator with a plurality of feed forward loops configured in a cascade manner. The method further includes generating the reverberations using the controlling parameters to control the reverberation generator.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
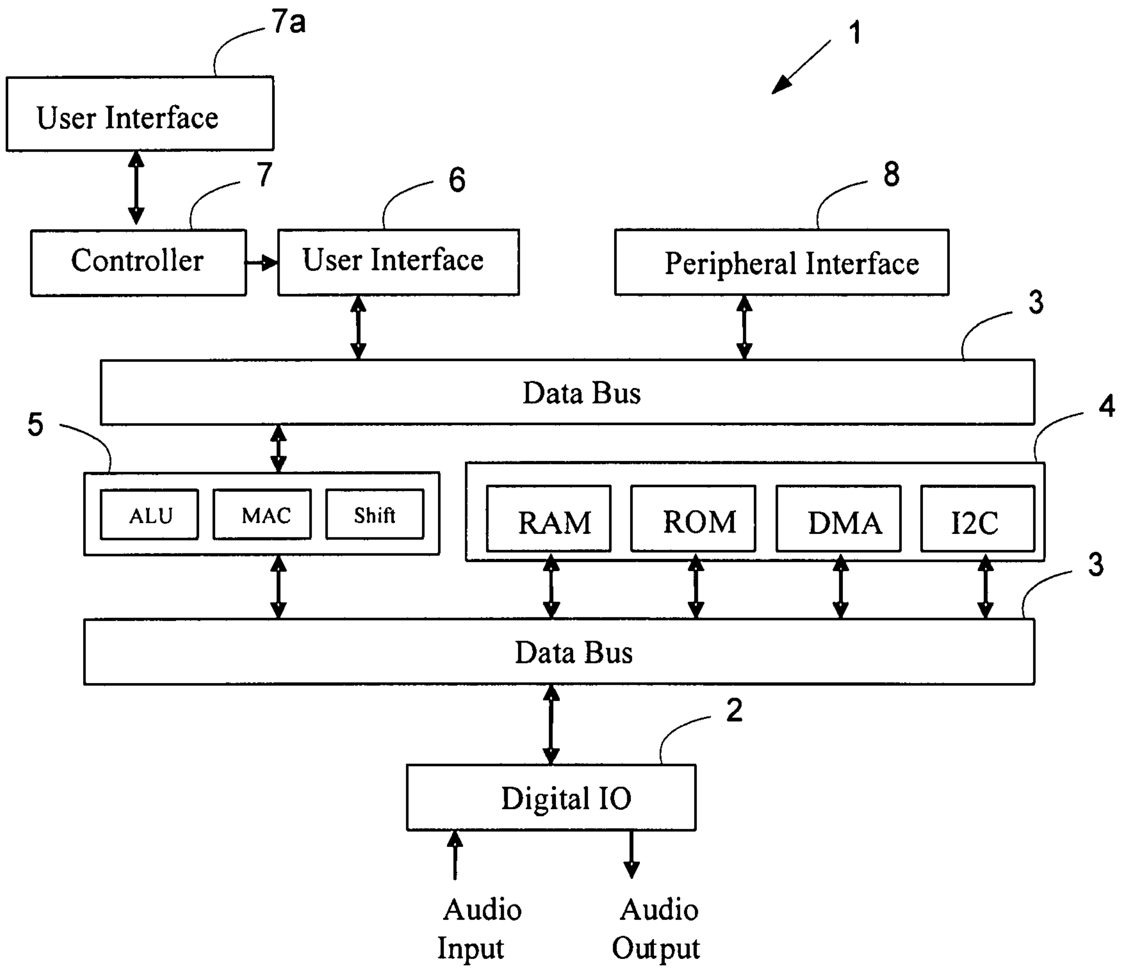
FIG. 1 is a schematic block diagram illustrating components of a typical digital audio signal processor.

Most conventional reverberation generation methods use digital signal processors (DSP), which have limited computational and memory resources. FIG. 1 is a schematic block diagram illustrating components of a typical digital audio signal processor. The digital audio signal processor 100 comprises a digital I/O interface 102 for inputting and outputting the audio data, a data bus 103 for transporting audio data within the processor and interconnecting with peripherals, a memory unit 104 for storing the input audio data and intermediate data from the executions of the processor, a computational unit 105 for loading the audio data and program data to host registers 106 and performing the processing then storing the processed audio data back to the I/O interface 102 for output.

The memory unit 104 comprises RAM, ROM, DMA, and I2C where the computational unit executes its programs and stores all the data. The computation unit 105 comprises ALU, MAC and Shift for performing additions, subtractions, multiplications, and other operations. It is well known that multiplications usually need more resources, and short filter lengths and fewer multiplications will save the load of the processor. The digital audio signal processor 100 further comprises a controller 107 that is usually present to control the processor through host registers which are interfaced with the computational unit through data bus. In addition, the controller 107 is connected to a User Interface 107*a* so that the user of the processor could input its instructions to the processor. Furthermore, the digital signal processor comprises a peripheral interface 108 through which the processor can interact with other components of an audio processing system. The peripheral can be any suitable device including, for example, keyboards and mice.

Figure 2:
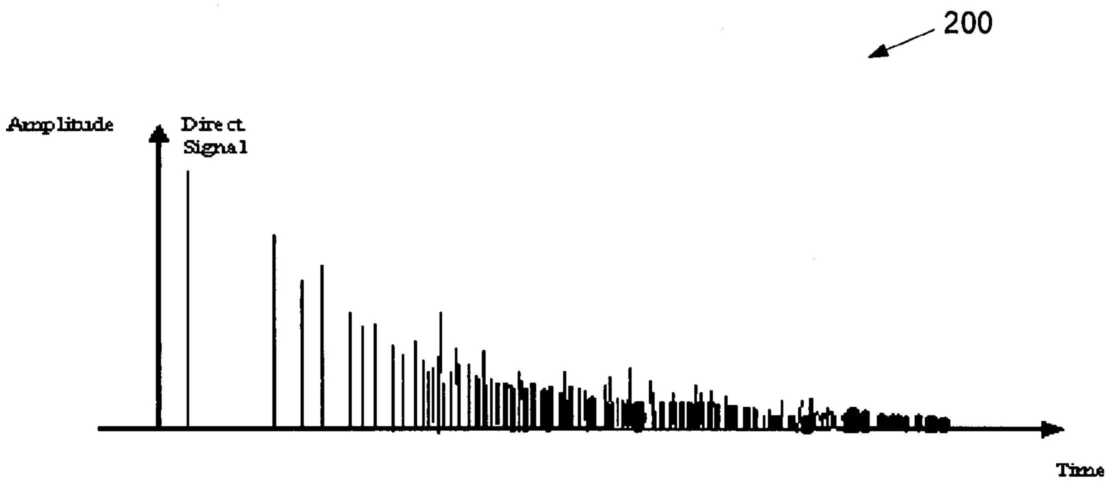
FIG. 2 shows a typical amplitude response of an audio signal in a real environment.

Now referring to FIG. 2, illustrates amplitudes of a direct signal and its reverberations 200 in a time domain in a real environment such as, for example, in a room. It is apparent that the direct signal reaches a listener's ears first and is followed by the echoes caused by reflections of floor, walls, ceiling and other surfaces. The characteristics of the echoes will be discussed in detail hereinafter. It is to be noted that the echoes do not change their pitches.

As illustrated in FIG. 2, the reverberation shows certain general characteristics including the following: that the early echoes are quite sparse after the direct sound; that the density of the echoes increases in the time domain; and that in the late part of the reverberation in the time domain, the echoes become increasingly diffused and dense. However, to simulate the reverberations, a reverberation model has to be established by extracting certain peculiar characteristics of the reverberations in each type of real environments.

The peculiar characteristics considered in the present disclosure include, for example, final echo density, rate of echo density to be built up, decay rate of the overall energy of echoes, and differential decay rates of high frequency signals and low frequency signals. For example, in a room, the final echo density and the rate of echo density to be built up depend on the size of the room. The smaller the room is, the faster the density of the echoes will be built up. Furthermore, the rate of decay of the overall energy level of the echoes depends on the absorption of the surfaces. In addition, the reflection surfaces generally absorb more high-frequency signals than low-frequency signals. As a result, the high-frequency signals decay faster than do the low-frequency signals. How fast the high-frequency signals decay with respect to the low-frequency signals depends on the surfaces of reflections.

Figure 3:
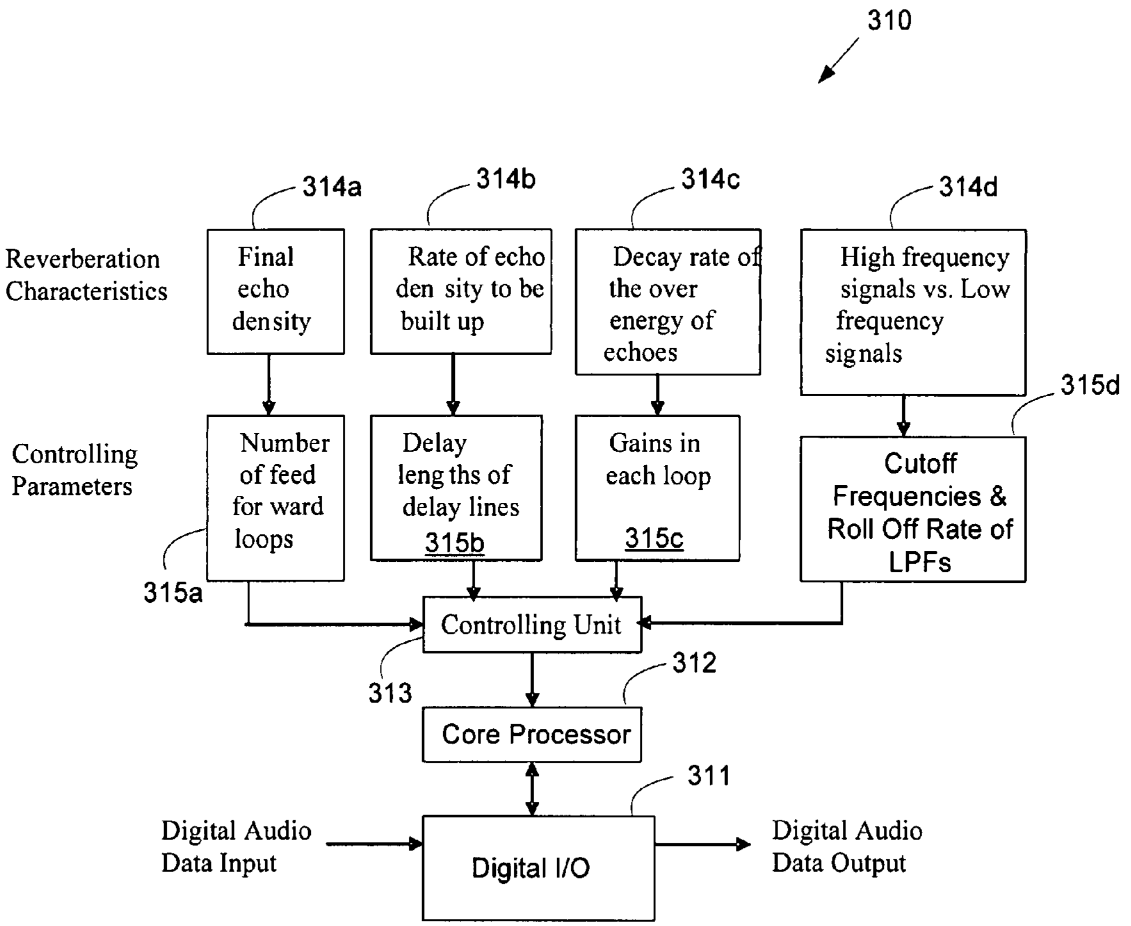
FIG. 3 is a schematic function block diagram of the controlling mechanism of the reverberation-generating process of a digital audio signal processing system in accordance with one embodiment of the present disclosure.

Now referring to FIG. 3, there is provided a schematic function block diagram of the controlling mechanism of the reverberation-generating process of a digital audio signal processing system in accordance with one embodiment of the present disclosure. As shown in FIG. 3, the digital audio signal processing system 310 comprises a digital I/O interface 311, a core processor 312, and a controlling unit 313. The digital I/O interface 311 and the core processor 312 are very similar or identical to the ones shown in FIG. 1, thus no detail description herein. The controlling unit 313 may be electronically connected to the controller 107 of FIG. 1 to control the reverberation generating process.

Still referring to FIG. 3, there is provided a more detailed description of the operation of the controlling unit 313. First, extract the peculiar reverberation characteristics of an audio signal from the audio signal reverberations of one real environment to be simulated. The peculiar reverberation characteristics include final echo density 314*a*, rate of the echo density to be built up 314*b*, decay rate of overall energy level of the echoes 314*c*, and differential decay rates of high-frequency signals and low-frequency signals 314*d*.

Then, these reverberation characteristics are translated into controlling parameters. More specifically, the final echo density 314*a* will be translated into the number of feed forward loops 315*a*. The final echo density is the number of echoes of a given time duration at the tail of the response. The number of feed forward loops to be used is determined in the following manner: the denser the echoes to be built up, the more loops should the structure have. Generally, three or more loops are required to have the desired effects. Because of the diffusive nature of the late reverberation and the way human auditory system works, a reasonable close approximation for the final echo density will give sufficient sensation of the real environment when other controlling parameters are correctly set. Generally, an open space such as a square will have lower echo density and experiment shows three to four loops are sufficient for the simulation. An enclosed massy environment such as a wet market will have a high echo density and a minimum of four loops is necessary.

The rate of echo density to be built up 314*b* will be translated into the delay lengths of delay lines 315*b*. As discussed hereinafter, the delay lines used in the digital signal processing device include the delay lines used in the loops and the delay lines used in the allpass filters. The rate of the echo density to be built up is defined as the distance between the echoes. It is vital for the simulation of the reverberation to have the first few echoes well generated because the human auditory system judges the environment depending very much on the first few echoes. As the echoes become more and more diffused in the later part of the reverberation, the distances between the consecutive echoes are of less importance to the human auditory system.

The delay lengths of the delay lines used in the loops and the delay lines used in the allpass filters can be determined in the following manner: the longer the delay lengths, the slower the echo density will be built up. The delay length of the delay line in the first loop (delay line 1) will be equal to the delay between the direct sound and the first echo. The delay length of the delay line in the first allpass filter (AP1) will be equal to the delay between the first echo and second echo. To simulate a large room like a church, the delay lengths in each delay line and each allpass filter will be relatively large. After the first loop, the delay lengths in the delay lines and allpass filters can be approximately calculated using the relationship exemplified by Equations 1 and 2, respectively.

$$DL_{n+1} \approx DL_n \times x \quad \text{(Eqn. 2)}$$

$$AP_{n+1} \approx AP_n \times y \quad \text{(Eqn. 4)}$$

In Equations 1 and 2, $DL_n$ is the length of delay line in the nth loop; $AP_n$ the length of the delay line in the nth allpass filter; x and y are the environment coefficients. The values of x and y vary from 1.1 to 1.5. The lengths of the delay lines $DL_n$ and $AP_n$ are preferable to be prime numbers, which will ensure a smooth decay of the reflection sound without significant burst signals.

The decay rate of the overall energy of echoes 314*c* will be translated into the gains in each loop 315*c*. The decay rate of the overall energy level of the echo is defined by the reduction of the energy of the echoes given a time period, which can be expressed by $$\frac{dE}{dt},$$

where E represents the energy of the echo and t represents the time. For example, a room with carpet floor absorbs sound much better than wooden floor. This characteristic can be translated into the gains in each loop: the smaller the gains are, the faster the over energy level of the echoes decays. The gain can be approximately calculated using the relationship exemplified by Equations 3 and 4 below.

$$G_1 = \sqrt{\frac{dE}{dt} * DL_1} \quad \text{(Eqn. 6)}$$

$$G_{n+1} = G_n \sqrt{\frac{dE}{dt} \times DL_{n+1}} \quad \text{(Eqn. 8)}$$

In Equations 3 and 4, $G_n$ is the gain for the nth loop and $DL_n$ is the length of the delay line in the nth loop. To simulate a room with higher absorption of sound, the gains in each loop will be small. Typically, the gain value in the first loop varies between 0.2 to 0.5. The gain values in subsequent loops vary between 1 to 2.

The differential decay rates of high-frequency signals and low-frequency signals 314*d* will be translated into the cutoff frequencies and roll off rate of lowpass filters 315*d*; the cutoff frequencies and roll off rates of the filters will determine how fast high-frequency signals decay with respect to low-frequency signals. For each environment, the decay rates of different frequencies vary. Generally, high frequency signals will be more absorbed by the reflection surfaces. The characteristics can be quantified as the relative difference in the change of energy of different frequencies. The mathematical expression for this characteristic is $$\frac{dE_f}{df * dt},$$

where $E_f$ represents the energy for a certain frequency f. This characteristic will be a very complex scenario to model.

But in most cases, low-pass filters may be used to have a reasonably close approximation due to the fact that high frequencies decay faster than low frequencies most of the time. The lowpass filters in each loop are used to simulate this characteristic. The lowpass filters can be realized by finite response filters (FIR) or infinite response filters (IIR). The cutoff frequencies and roll off rates of the filters will determine how fast high-frequency signals decay with respect to low-frequency signals. The filter may be a first order lowpass filter generally represented by Equation 5 below.

$$y_n = b * x_n - a * y_{n-1} \quad \text{(Eqn. 5)}$$

In Equation 5, a=1-b. It should be understood by those who are skilled in the art that the lowpass filters can be implemented with different structures and methods, without being limited to the one this patent provides. The cutoff frequencies of the lowpass filter will be very specific environment dependent. The cutoff frequency for a typical room environment is recommended to be between 5,000 and 15,000 with the first order lowpass filter implementation provided.

Then, these parameters will be passed to a control unit controlling the core processor, which loads the input digital audio data from the I/O interface, performs the reverberation generation. The output signal including the reverberation generated is sent out through the I/O interface.

The method of the present disclosure for generating reverberations is unique because it gradually builds up the density of the reverberations and at the same time decays different frequency components discriminately. At the same time, other characteristics including the final echo density and the decay rate of the overall energy level will also be controlled depending on the real environment characteristics. Therefore, the reverberations generated will closely match the characteristics of the real environments. Coloration of the sound is also minimized through the use of allpass filters and delay lines.

Figure 4:
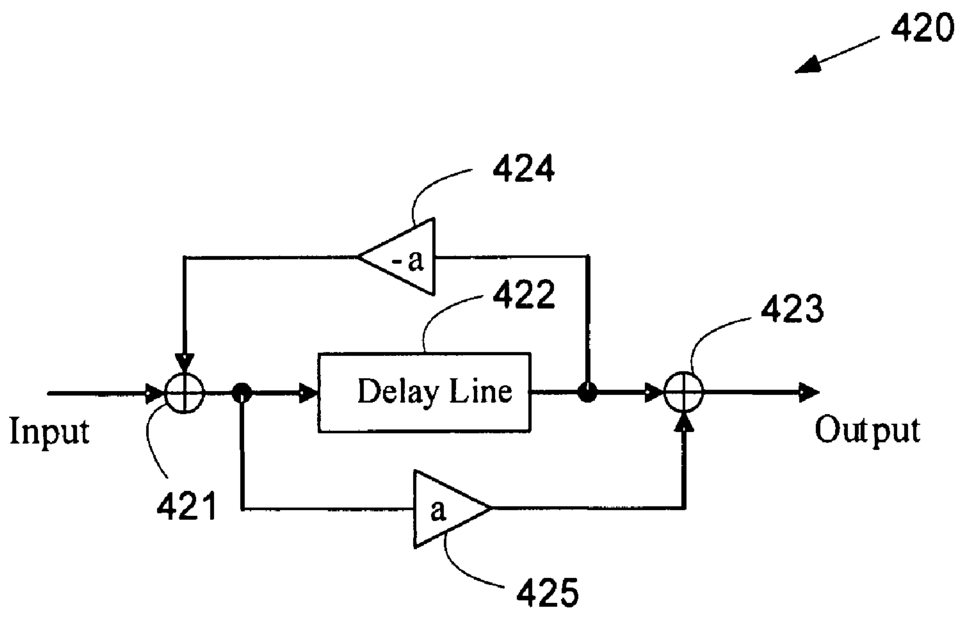
FIG. 4 is a schematic block circuit diagram illustrating the allpass filter used in the digital audio signal processor for the generation of reverberation in accordance with one embodiment of the present disclosure.

Now referring to FIG. 4, there is provided a schematic block circuit diagram illustrating the allpass filter used in the digital audio signal processor for the generation of reverberation in accordance with one embodiment of the present disclosure. The allpass filter 420 comprises an input adder 421, a delay line 422, an output adder 423, a feedback loop 424 with an amplifier (−a), and a feed forward loop 425 with an amplifier (a). The allpass filter 420 has a flat frequency response, thus introducing little coloration to the sounds. The value of (a) can be between 0.6 and 0.7.

Figure 5:
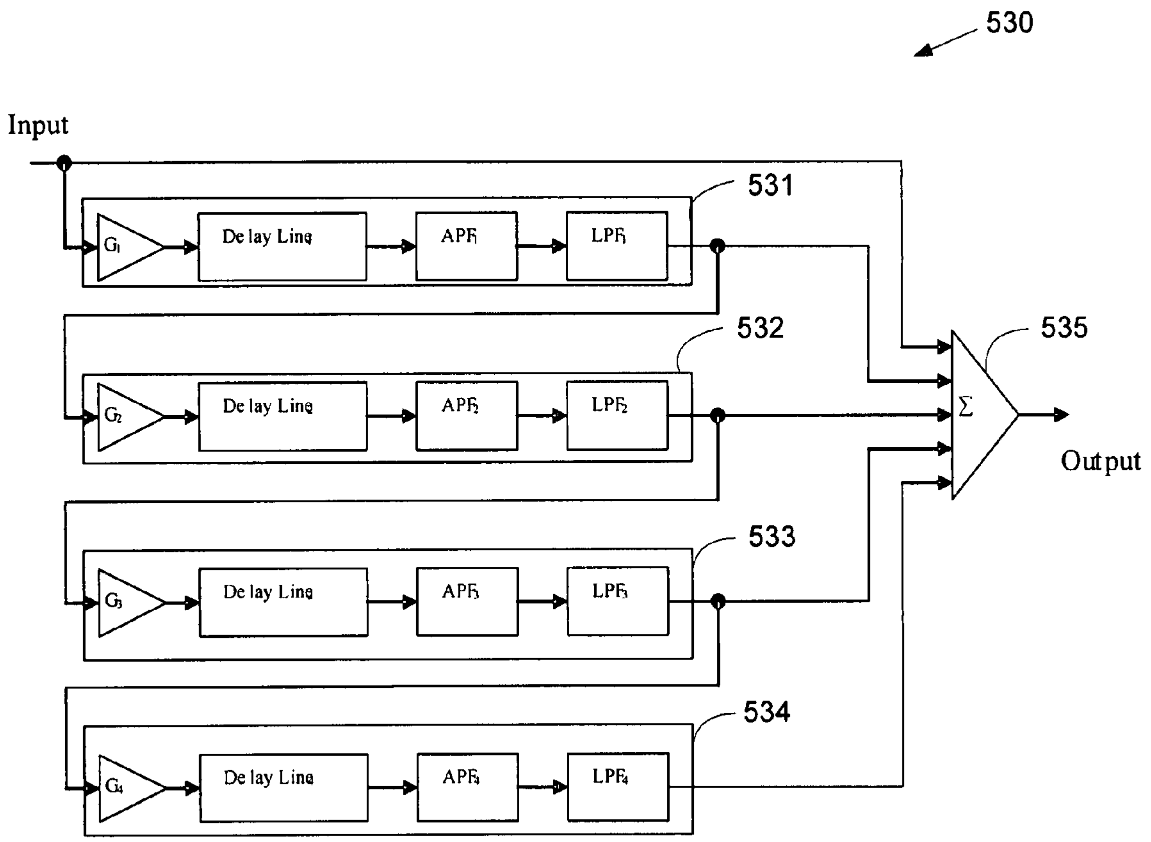
FIG. 5 is a schematic block circuit diagram of a reverberation generator used in the digital audio signal processing system in accordance with one embodiment of the present disclosure.

Now referring to FIG. 5, there is provided a schematic block circuit diagram of a reverberation generator used in the digital audio signal processing system in accordance with one embodiment of the present disclosure. The reverberation generator 530 comprises a plurality of feed forward loops 531, 532, 533, 534 configured in a cascade manner, and a summer 535. Each of the feed forward loops comprises a gain, a delay line, an allpass filter shown in FIG. 4 and a lowpass filter. The reverberation generator 530 uses the controlling parameters passed by the control unit to perform the generation process of reverberations for an input signal.

The input signal is sent without manipulation to the summer 535 to simulate the direct signal in the output. The input signal is also to be sent to a first feed forward loop. The output of the first feed forward loop is sent to the summer 535 to simulate early reverberations in the output, and at the same time is used as the input of a second feed forward loop. The output of the second feed forward loop is sent to the summer 535 to simulate later-than-early reverberations in the output, and is used as the input of a third feed forward loop and so on. The output of the reverberation generator is the sum of the direct signal and all the outputs of the feed forward loops. The diagram only shows 4 feed forward loops, but the number of loops is not limited to 4 and can be changed when necessary.

The delay line in the first loop is recommended to be equal to the delay time between the direct signal and the first echo. The delay lines used in the feed forward loops and allpass filters can be realized by circular buffers in digital signal processing. The lowpass filters can be realized by FIR and IIR filters, generally, first order IIR filters will be sufficient for most of the environments.

In one embodiment, this circuit generates the direct and reverberation signals. The gain in each loop controls the rate of decay of the overall energy level of the reverberation signals. The cascaded allpass filters will create dense echoes. With the delay lines used in each loop, the structure will create reverberations with increasing density of the echoes. The lowpass filters used in each loop will create the effect of faster decay of high-frequency signals.

Moreover, the computational cost of generating reverberations using the digital signal processing device of the present disclosure is reasonably low for the following reasons: the design involves very few multiplications; all the delay lines can be realized by circular buffers; and the lowpass filters can be as simple as first order IIR filters.

Figure 6:
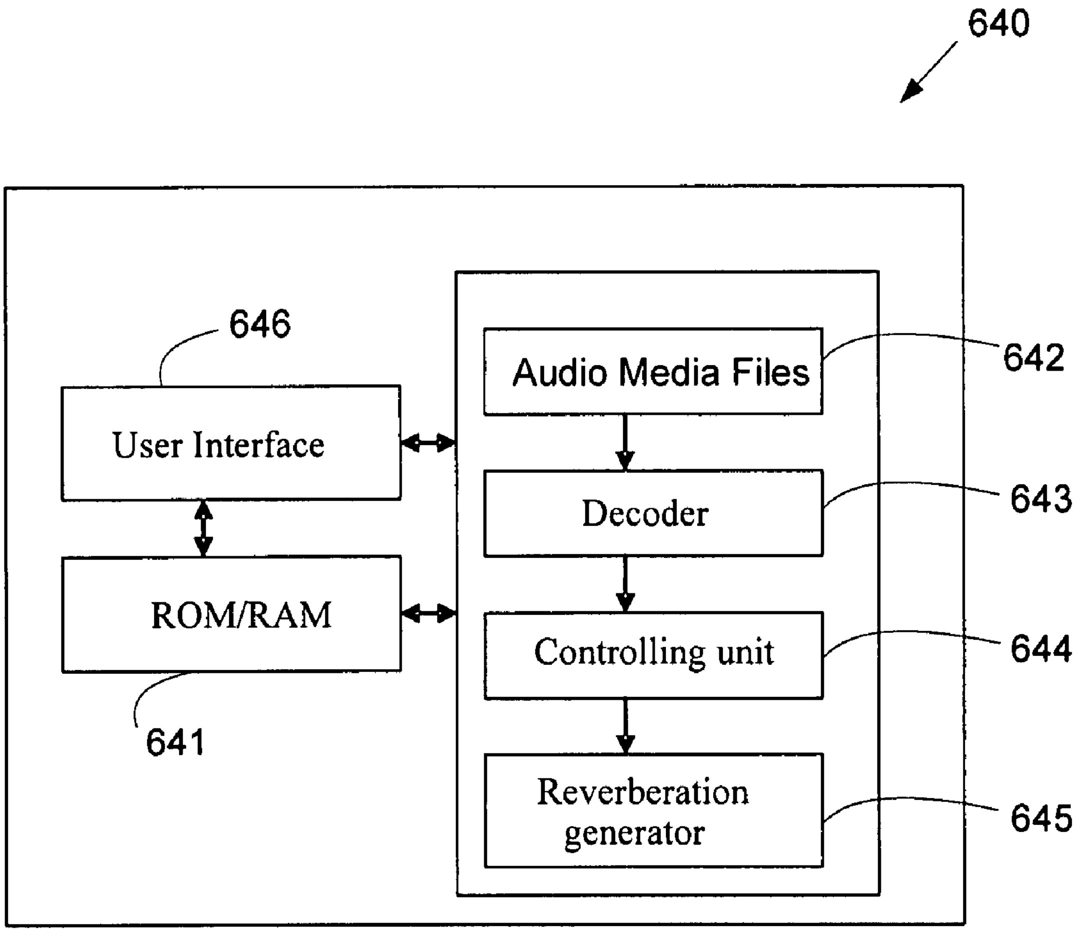
FIG. 6 is a schematic functional diagram of an electronic audio device illustrating the applications of the digital audio signal processor in accordance with one embodiment of the present disclosure.

Now referring to FIG. 6, there is provided a schematic functional diagram of an electronic audio device illustrating the applications of the digital audio signal processor in accordance with one embodiment of the present disclosure. The MP3 player 640 comprises a memory domain 641 for storing all databases and enabling all computational executions, an audio media file database 642, a decoder 643 for decoding all audio media files before each file is output, a controlling unit 644 for performing the controlling process of the reverberation generation, and a reverberation generator 645 for generating the reverberations according to the characteristics controlled by the controlling unit. The memory domain 641, file database 642, and decoder 643 may be any suitable respective device. The electronics that can employ the digital audio signal processing system of the present disclosure further include handphones, portable players, TV, DVD player, and the like.

Figure 7:
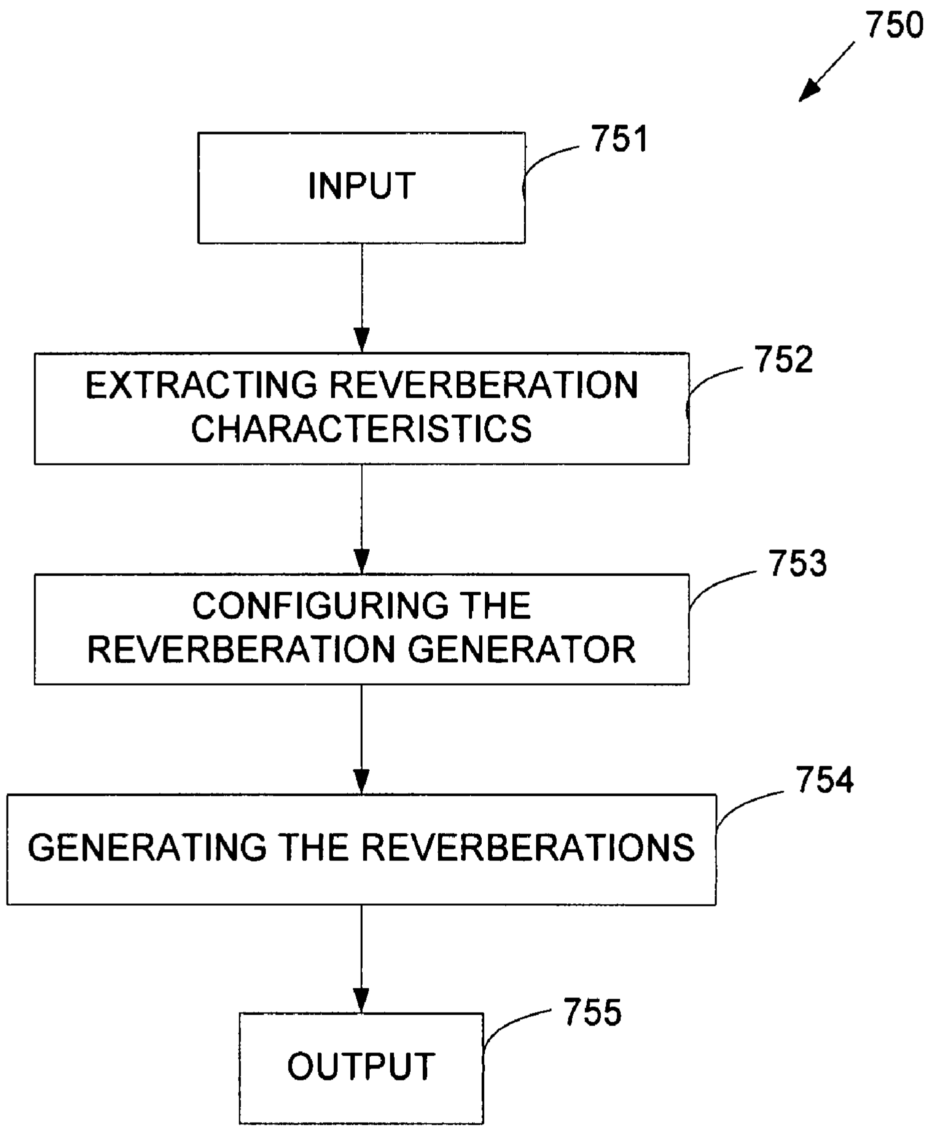
FIG. 7 is a somewhat simplified flowchart illustrating a method of generating reverberations for a digital audio signal in accordance with one embodiment of the present disclosure.

Now referring to FIG. 7, there is provided a flowchart of generating reverberations for a digital audio signal in accordance with one embodiment of the present disclosure. The generation of reverberation 750 of an input digital audio signal 751 starts by choosing one real environment to be simulated and extracting the reverberation characteristics for the chosen environment 752; then the reverberation generator is configured with the control of the reverberation characteristics (i.e., setting up the parameters of the reverberation generator including the number of feed forward loops, and the gains, delay lines, allpass filters, and low pass filters for each loop) 753; then the simulated reverberation is generated 754 and output 755.

In the step of extracting reverberation characteristics, the extracted reverberation characteristics include the final echo density 314*a*, the rate of the echo density to be built up 314*b*, the decay rate of overall energy level of the echoes 314*c*, and the differential decay rates of high-frequency signals and low-frequency signals 314*d*, as shown in FIG. 3. The translation of the characteristics into controlling parameters of the reverberation generator has been discussed above.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. For use in a digital audio signal processor, a reverberation generator comprising:

an input configured to receive a digital audio signal input;

a summing circuit configured to generate a digital audio signal output containing the digital audio signal input and reverberations;

a digital audio signal direct path connected to the input and the summing circuit, the digital audio signal direct path configured to provide the digital audio signal input to the summing circuit without manipulation; and a plurality of feed forward loops configured in a cascade manner, wherein the outputs of the feed forward loops are connected to the summing circuit, a first one of the feed forward loops is connected to the input, and an output of the first feed forward loops is configured to be fed to the summing circuit and an input of a second one of the feed forward loops.

2. The reverberation generator of claim 1, wherein an output of the second feed forward loop is configured to be fed to the summing circuit and an input of a third one of the feed forward loops.

3. The reverberation generator of claim 1, wherein the feed forward loops comprise a gain, a delay line, an allpass filter, and a lowpass filter.

4. The reverberation generator of claim 3, wherein the allpass filter comprises:

an input adder configured to sum up the input to the allpass filter and a feedback from a delay line, wherein the delay line is electronically downstream of the input adder;

a feedback loop configured to use an output of the delay line as the feedback to the input adder, wherein the feedback loop comprises a feedback amplifier having a feedback gain (−a);

a feed forward loop connected to the input adder, wherein the feed forward loop comprises an amplifier having a feed forward gain (a); and an output adder configured to sum up the outputs from the delay line and the feed forward loop.

5. The reverberation generator of claim 4, wherein an absolute value of the feedback gain (−a) and the feed forward gain (a) is between 0.6 and 0.7.

6. The reverberation generator of claim 4, wherein the length of the delay line in the first allpass filter is equal to the delay time between the first echo and the second echo.

7. The reverberation generator of claim 4, wherein the lengths of all the delay lines and allpass filters are prime numbers.

8. The reverberation generator of claim 4, wherein the length of the delay lines in the allpass filters except for the first allpass filter (APn+1) is given by $AP_{n+1} \approx AP_n \times y$, wherein APn is the length of the delay line in the nth allpass filter, and y is an environment coefficient having a value between 1.1 to 1.5.

9. The reverberation generator of claim 3, wherein the delay line in the first loop is set to be equal to the delay time between a direct signal and its first echo.

10. The reverberation generator of claim 9, wherein the length of the delay line in any loop except for the first loop (DLn+1) is given by $DL_{n+1} \approx DL_n \times x$, wherein DLn is the length of delay line in the nth loop, and x is an environment coefficient having a value between 1.1 to 1.5.

11. The reverberation generator of claim 4, wherein the delay lines used in the feed forward loops and allpass filters are realized by circular buffers in digital signal processing.

12. The reverberation generator of claim 3, wherein the gain at a particular feed forward loop is given by $$G_1 = \sqrt{\frac{dE}{dt} * DL_1}$$

and $$G_{n+1} = G_n \sqrt{\frac{dE}{dt} \times DL_{n+1}},$$

wherein Gn is the gain for the nth feed forward loop and DLn is the length of the delay line in the nth loop.

13. The reverberation generator of claim 11, wherein the gain in the first feed forward loop varies between 0.2 to 0.5 and the gain in subsequent feed forward loops varies between 1 to 2.

14. The reverberation generator of claim 3, wherein the lowpass filters comprise at least one of: FIR filters, IIR filters, and first order IIR filters.

15. The reverberation generator of claim 1, wherein the reverberation generator is configured to combine the reverberation with the digital audio signal input to produce a digital audio signal output simulating a real environment.

16. A digital audio signal processing system comprising:

a digital I/O interface configured to input and output digital audio signals;

a controlling unit connected to the digital I/O interface configured to receive the inputted digital audio signals, wherein the controlling unit is configured to extract reverberation characteristics of the inputted digital audio signals, the reverberation characteristics comprising at least one of: a final echo density, a rate of the echo density to be built up, and a differential decay rate of a high-frequency signal and a low-frequency signal; and a reverberation generator coupled to the controlling unit, the reverberation generator configured to generate, according to the extracted reverberation characteristics, reverberations for the inputted digital audio signals to simulate a real environment, the reverberation generator comprising:

a plurality of feed forward loops configured in a cascade manner; and a summing circuit configured to receive outputs of the plurality of feed forward loops and output the digital audio signals, wherein a first one of the feed forward loops is connected to the inputted digital audio signals, and an output of the first feed forward loops is configured to be fed to the summing circuit and an input of a second one of the feed forward loops.

17. The system of claim 16, wherein the reverberation characteristics comprises a decay rate of overall energy level of the echoes.

18. The system of claim 16, wherein an output of the second feed forward loop is configured to be fed to the summing circuit and an input of a third one of the feed forward loops.

19. A method of generating reverberations for a digital audio signal to simulate real environments, the method comprising:

extracting the reverberation characteristics of the digital audio signal for a real environment, the reverberation characteristics comprising at least one of: a final echo density, a rate of the echo density to be built up, and a differential decay rate of a high-frequency signal and a low-frequency signal;

translating the extracted reverberation characteristics into controlling parameters for a reverberation generator with a plurality of feed forward loops configured in a cascade manner, and a summing circuit configured to receive the outputs of the feed forward loops, wherein a first one of the feed forward loops is connected to the inputted digital audio signals, and an output of the first feed forward loops is configured to be fed to the summing circuit and an input of a second one of the feed forward loops; and generating the reverberations using the controlling parameters to control the reverberation generator.

20. The method of claim 19, wherein the reverberation characteristics comprise a decay rate of overall energy level of the echoes.

21. The method of claim 19, wherein each of the feed forward loops comprises a gain, a delay line, an allpass filter, and a lowpass filter.

22. The method of claim 21, wherein the allpass filter comprises:

an input adder configured to sum up the input to the allpass filter and a feedback from a delay line, wherein the delay line is electronically downstream of the input adder;

a feedback loop configured to use an output of the delay line as the feedback to the input adder, wherein the feedback loop comprises a feedback amplifier having a feedback gain (−a);

a feed forward loop connected to the input adder, wherein the feed forward loop comprises an amplifier having a feed forward gain (a); and an output adder configured to sum up the outputs from the delay line and the feed forward loop.

23. The method of claim 20, wherein the delay line in the first loop is equal to the delay time between a direct signal and its first echo.

24. The method of claim 20, wherein the controlling parameters of the reverberation generator include at least one of: a number of feed forward loops, a length of the delay line, a gain used in the feed forward loops, and a cutoff frequency and roll off rate of the lowpass filters.

25. The method of claim 24, wherein the reverberation generator generates reverberations by:

controlling the final echo density by the number of feed forward loops;

controlling the rate of the echo density to be built up by the lengths of the delay lines used in the feed forward loops and allpass filters;

controlling the decay rate of the overall energy level of the echoes by the gain used in the feed forward loops; and controlling the decay of high frequency signals with respect to low frequency signals with the cutoff frequencies and roll off rates of the lowpass filters.

* * * * *